United States Patent
Iga et al.

(10) Patent No.: US 12,326,642 B2
(45) Date of Patent: Jun. 10, 2025

(54) WAVELENGTH FILTER AND LASER APPARATUS

(71) Applicant: Fujitsu Optical Components Limited, Kawasaki (JP)

(72) Inventors: Yukie Iga, Tachikawa (JP); Hirotomo Izumi, Kawasaki (JP); Kazumasa Takabayashi, Atsugi (JP); Suguru Akiyama, Tsukuba (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 466 days.

(21) Appl. No.: 17/845,365

(22) Filed: Jun. 21, 2022

(65) Prior Publication Data
US 2023/0035193 A1    Feb. 2, 2023

(30) Foreign Application Priority Data
Jul. 27, 2021   (JP) .................................. 2021-122248

(51) Int. Cl.
  *G02F 1/21*   (2006.01)
  *G02F 1/225*  (2006.01)
  *H01S 5/00*   (2006.01)
  *H01S 5/50*   (2006.01)

(52) U.S. Cl.
  CPC .............. *G02F 1/212* (2021.01); *G02F 1/225* (2013.01); *H01S 5/005* (2013.01); *G02F 2203/055* (2013.01); *H01S 5/50* (2013.01)

(58) Field of Classification Search
  CPC ........... G02F 1/212; G02F 1/225; H01S 5/005
  See application file for complete search history.

(56) References Cited

U.S. PATENT DOCUMENTS

| | | | |
|---|---|---|---|
| 9,608,406 B1* | 3/2017 | Lee | H01S 5/0612 |
| 2006/0153267 A1 | 7/2006 | Suzuki et al. | |
| 2009/0220228 A1* | 9/2009 | Popovic | H04J 14/0204 398/48 |
| 2017/0293083 A1* | 10/2017 | Menard | G02F 1/218 |

FOREIGN PATENT DOCUMENTS

| | | |
|---|---|---|
| JP | 2004-102097 A | 4/2004 |
| JP | 2006-196554 | 7/2006 |
| JP | 2011-75767 A | 4/2011 |
| JP | 2015-154052 A | 8/2015 |

OTHER PUBLICATIONS

Japanese Office Action issued in counterpart Japanese Application No. 2021-122248 dated Apr. 22, 2025.

* cited by examiner

*Primary Examiner* — Tina Wong
(74) *Attorney, Agent, or Firm* — STAAS & HALSEY LLP

(57) ABSTRACT

A wavelength filter includes a first filter circuit and a second filter circuit. The first filter circuit that has a passband that is obtained from a vernier effect by connecting, in series, a plurality of ring resonators each having a different transmission wavelength interval and that is within a gain band of an optical amplifier, and that passes, from the gain band, light at a selected wavelength and light that has a wavelength in a recursive mode and that is produced on a short wavelength side or a long wavelength side of the selected wavelength. The second filter circuit is connected to the first filter circuit in series and suppresses the light at the wavelength in the recursive mode from the light passing through the first filter circuit.

20 Claims, 6 Drawing Sheets

WAVELENGTH FILTER AND LASER APPARATUS

CROSS-REFERENCE TO RELATED APPLICATION

This application is based upon and claims the benefit of priority of the prior Japanese Patent Application No. 2021-122248, filed on Jul. 27, 2021, the entire contents of which are incorporated herein by reference.

FIELD

The embodiment discussed herein is related to a wavelength filter and a laser apparatus.

BACKGROUND

In recent years, in a large-capacity optical communication system, digital coherent optical communication performed on the basis of phase modulation becomes mainstream. In this communication system, for example, there is a demand for a laser apparatus that meets various requests, such as a size reduction and a single wavelength property, a narrow line width, and a wide wavelength variable range at the time of oscillation. In order to satisfy these requests, integration of optical elements is needed. Accordingly, for example, a wavelength tunable laser apparatus having a hybrid packaging structure constituted of a wavelength filter that is disposed on a silicon substrate and that has a wavelength selection function and an optical amplifier, such as a semiconductor optical amplifier (SOA), has been drawing attention.

The wavelength filter has the wavelength selection function for allowing transmission of a specific selected wavelength from a predetermined communication wavelength band by using a vernier effect of, for example, two ring resonators each having a different resonance wavelength interval. Each of the ring resonators resonates at the associated resonance wavelength, and a transmittance is the maximum at this resonance wavelength, whereas a transmittance is the minimum at an intermediate wavelength of the resonance wavelength. The interval of the resonance wavelength is constant, and a transmission wavelength interval of this interval is defined as a free spectral range (FSR). Regarding the vernier effect, the FSR that corresponds to the least common multiple of the FSR for transmission of each of the ring resonators, that is, the FSR of all of the ring resonators, is represented by FSRtotal.

FIG. 7 is a diagram illustrating an example of the filter characteristics of a $11^{th}$ ring resonator and a $12^{th}$ ring resonator. Furthermore, for convenience of description, regarding the two ring resonators, the FSR of the $11^{th}$ ring resonator is denoted by a FSR 11, whereas the FSR of the $12^{th}$ ring resonator is denoted by a FSR 12.

In FIG. 7, a passband T11 of the $11^{th}$ ring resonator is indicated by the solid line, a passband T12 of the $12^{th}$ ring resonator is indicated by the dotted line, and a passband T11*T12 of the $11^{th}$ ring resonator and the $12^{th}$ ring resonator is indicated by the thick line. The FSR 11 of the $11^{th}$ ring resonator and the FSR 12 of the 12th ring resonator are different. Due to the vernier effects of the FSR 11 and the FSR 12, at the total T11*T12 of the passband, the transmittance is a peak (a first mode M1) that is the maximum at the wavelength in which the resonance wavelengths of the $11^{th}$ ring resonator and the $12^{th}$ ring resonator overlap with each other.

The peak of a second mode M2 is formed adjacent to both sides of the peak of the first mode M1, whereas the peak of a third mode M3 is formed adjacent to both sides of the peak of the first mode M1. In the second mode M2, an overlap of the resonance wavelength is smaller than that in the first mode M1, so that the peak of the second mode M2 is lower than the peak of the first mode M1. Furthermore, also, in the third mode M3, an overlap of the resonance wavelength is smaller than that in the second mode M2, so that the peak of the third mode M3 is also lower than the peak of the second mode M2.

FIG. 8 is a diagram illustrating an example of a recursive mode with respect to a first mode M1. The first mode M1 has a wavelength transmittance in which the resonance wavelengths of the $11^{th}$ ring resonator and the $12^{th}$ ring resonator overlap. In the range of ±FSRtotal from the first mode M1, the wavelength in which the passband T11 of the $11^{th}$ ring resonator is completely matched with the passband T12 of the $12^{th}$ ring resonator is only one point. Then, the first mode M1 (M4) in which the passband T11 overlaps with the passband T12 is repeated for each FSRtotal. The repeated first mode M1 (M4) is a recursive mode with respect to the first mode M1.

Thus, for the FSRtotal, the passband of each of the $11^{th}$ ring resonator and the $12^{th}$ ring resonator is designed to be FSRtotal used wavelength range such that any overlap other than the selected wavelength is not generated in a wavelength range that is used for the optical communication.

Furthermore, the passband T11 of the $11^{th}$ ring resonator and the passband T12 of the $12^{th}$ ring resonator have a periodic bandwidth. In the FSRtotal, an overlap of the passband is generated other than the first mode M1 and, for example, the second mode M2, the third mode M3, and the like are present. For example, a mode gain difference that is a transmission ratio of the peak of the first mode M1 to the peak of the second mode M2 or a transmission ratio of the peak of the first mode M1 to the peak of the third mode M3 is present. The mode gain difference is an indicator for evaluating a single wavelength property. In general, it is desired that the mode gain difference of a laser apparatus be larger than or equal to, for example, 3 dB.

However, the range of the FSRtotal is made to be expanded within the used wavelength range by adjusting the FSR of each of the $11^{th}$ ring resonator and the $12^{th}$ ring resonator. Consequently, as a result of the range of the FSRtotal being expanded, even though the recursive mode is able to be ignored, a mode gain difference between the peak of the selected wavelength and the peak of the wavelength close to the selected wavelength is decreased.

Accordingly, in general, the used wavelength range of the optical communication covers equal to or greater than 30 nm, so that the mode gain difference is decreased by expanding the range of the FSRtotal so as to ignore the recursive mode. FIG. 9 is a diagram illustrating an example of transmittance, in a first mode M1, a second mode M2, and a third mode M3, of the $11^{th}$ ring resonator, the $12^{th}$ ring resonator, and an AMZI that are conventionally used.

The wavelength filter has a configuration in which the $11^{th}$ ring resonator and the $12^{th}$ ring resonator are connected to the AMZI in series. The dotted line indicated in FIG. 9 is the passband T11*T12 of the $11^{th}$ ring resonator and the $12^{th}$ ring resonator, the solid line is the passband T13 of the AMZI, the thick line is the passband T11*T12*T13 of the $11^{th}$ ring resonator, the $12^{th}$ ring resonator, and the AMZI. In this case, the range of the FSRtotal is made to be expanded, so that it is possible to ignore the recursive mode.

However, even if it is possible to ignore the recursive mode, there is a need to secure the mode gain difference greater than or equal to 3 dB. Thus, the AMZI is configured to set, for example, the passband T13 for blocking the wavelength in the vicinity of the second mode M2. The AMZI blocks the wavelength in the vicinity of the second mode M2, so that the mode gain difference between the first mode M1 and the second mode M2 is improved from −2.5 dB to less than or equal to −10 dB. As a result, even when the range of the FSRtotal is expanded, this indicates that the mode gain difference is secured in a level greater than or equal to 3 dB.

Accordingly, in order to block the wavelength in the vicinity of the second mode M2, a FSR 13 that is the FSR of the AMZI is set to be 1.5 times to 3 times the mean value of the FSR 11 of the $11^{th}$ ring resonator and the FSR 12 of the $12^{th}$ ring resonator.

Patent Document 1: Japanese Laid-open Patent Publication No. 2004-102097
Patent Document 2: Japanese Laid-open Patent Publication No. 2011-75767
Patent Document 3: Japanese Laid-open Patent Publication No. 2015-154052

However, the FSR 13 of the AMZI used in the conventional laser apparatus is closer to the FSR 11 of the $11^{th}$ ring resonator and the FSR 12 of the $12^{th}$ ring resonator, so that the FSR 13 exhibits a steep slope in the filter characteristics illustrated in FIG. 9. As a result, for example, if the passband of the AMZI is shifted, the peak of the first mode M1 that corresponds to the most overlap point between the transmittance of the $11^{th}$ ring resonator and the $12^{th}$ ring resonator is out of the passband.

FIG. 10 is a diagram illustrating an example of transmittance in the first mode, the second mode, and the third mode in the case where a passband of the AMZI is shifted. If the passband of the AMZI is shifted by an amount about, for example, 2 nm, light in the second mode M2 is included in the passband of the AMZI, so that a part of the light in the second mode M2 is accordingly passed. Furthermore, the peak of the first mode M1 is out of the passband of the AMZI, and thus, the light, which is in the first mode M1, at the selected wavelength is accordingly suppressed. As a result, even if the passband of the AMZI is slightly shifted, the intensity of the light at the selected wavelength in the first mode M1 is consequently reduced by 1 dB.

SUMMARY

According to an aspect of an embodiment, a wavelength filter includes a first filter circuit and a second filter circuit. The first filter circuit has a passband that is obtained from a vernier effect by connecting, in series, a plurality of ring resonators each having a different transmission wavelength interval and that is within a gain band of an optical amplifier. The first filter circuit passes, from the gain band, light at a selected wavelength and light that has a wavelength in a recursive mode and that is produced on a short wavelength side or a long wavelength side of the selected wavelength. The second filter circuit is connected to the first filter circuit in series and suppresses the light at the wavelength in the recursive mode from the light passing through the first filter circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. Furthermore, the present invention is not limited to the embodiments.

Embodiment

Figure 1:
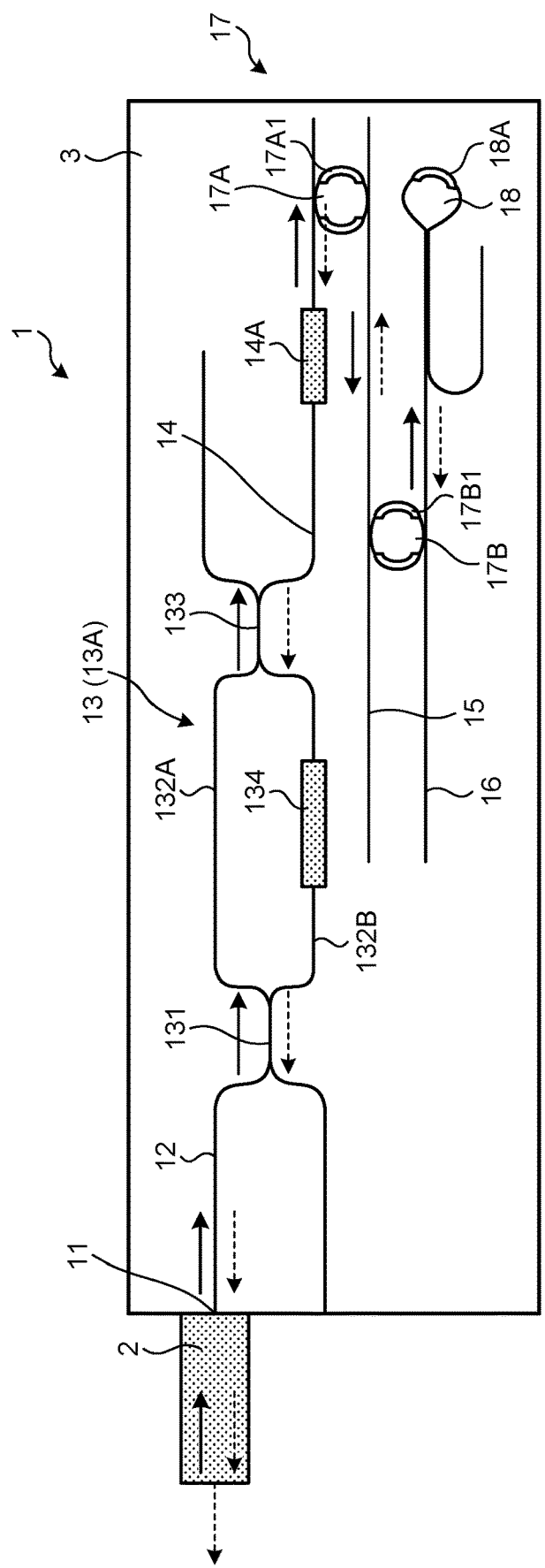
FIG. 1 is a block diagram illustrating an example of a configuration of a laser apparatus according to a present embodiment.

FIG. 1 is a block diagram illustrating an example of a configuration of the laser apparatus according to the present embodiment. A laser apparatus 1 illustrated in FIG. 1 includes a semiconductor optical amplifier (SOA) 2, and a wavelength filter 3, and is a wavelength laser apparatus having a hybrid packaging structure constituted of the SOA 2 and the wavelength filter 3. In the laser apparatus 1, a stimulated emission state that exceeds a loss caused by the hybrid packaging, a propagation loss in the wavelength filter 3, an absorption loss inside the SOA 2 is implemented.

The SOA 2 is an optical amplifier having a gain band. Furthermore, the gain band is a wavelength band that is within a used wavelength range of optical communication and that includes a wavelength in a recursive mode produced in a selected wavelength and produced on a long wavelength side or a short wavelength side of the selected wavelength.

A connecting unit included in the SOA 2 is precisely implemented to have a hybrid packaging structure when the SOA 2 is connected to the wavelength filter 3 so as not to produce a light loss as much as possible. The SOA 2 produces amplified spontaneous emission (ASE) in accordance with a drive current. In the SOA 2, if an amount of the drive current increases, the ASE increases. The ASE is subjected to wavelength selection by the wavelength filter 3 that is controlled by the phase shifter, is returned at a reflecting mirror 18 included in the wavelength filter 3, and again enters the SOA 2. The return light that is again input to the SOA 2 is a single wavelength.

The wavelength filter 3 is a wavelength filter that passes the light at the selected wavelength out of the light that is within the gain band and that is input from the SOA 2, and that returns the transmitted light at the selected wavelength to the SOA 2. The SOA 2 amplifies the light at the selected wavelength that is input from the wavelength filter 3, and outputs the amplified light at the selected wavelength to for example, a transmitter or a receiver as laser light.

The wavelength filter 3 includes an input/output unit 11, a first optical waveguide 12, a second filter circuit 13, a second optical waveguide 14, a third optical waveguide 15, a fourth optical waveguide 16, a first filter circuit 17, and the reflecting mirror 18. The wavelength filter 3 is a loop type closed circuit that returns the light received from the input/output unit 11 at the reflecting mirror 18, and that outputs, from the input/output unit 11, the return light that has been returned at the reflecting mirror 18.

The input/output unit 11 is an input/output unit of the wavelength filter 3 that performs optical coupling between the SOA 2 and the first optical waveguide 12. The second filter circuit 13 includes an asymmetric Mach-Zehnder interferometer (AMZI) 13A. The first filter circuit 17 includes a first ring resonator 17A and a second ring resonator 17B.

The first optical waveguide 12 is an optical waveguide that optically couples the input/output unit 11 and the AMZI 13A. The second optical waveguide 14 is an optical waveguide that optically couples the AMZI 13A and the first ring resonator 17A. The third optical waveguide 15 is an optical waveguide that optically couples the first ring resonator 17A and the second ring resonator 17B. The fourth optical waveguide 16 is an optical waveguide that optically couples the second ring resonator 17B and the reflecting mirror 18. The reflecting mirror 18 is a returning unit that is included in the wavelength filter 3 and that is optically coupled with the fourth optical waveguide 16.

The AMZI 13A includes a first coupler 131, a first arm 132A, a second arm 132B, a second coupler 133, and a first phase shifter 134 that is disposed on the second arm 132B. The first coupler 131 has a branching function for branching and outputting the light received from the first optical waveguide 12 to the first arm 132A and the second arm 132B. The first arm 132A and the second arm 132B adjust the passband of the light passing through the first arm 132A and the second arm 132B, respectively, by changing the refractive index of the light in accordance with a drive voltage. The second coupler 133 has a multiplexing function for multiplexing the light passing through the first arm 132A and the light passing through the second arm 132B and outputting the multiplexed light to the second optical waveguide 14. The first phase shifter 134 is disposed on the second arm 132B, so that the first phase shifter 134 is a heater that adjusts the phase of the light passing through the second arm 132B by adjusting the temperature of, for example, the second arm 132B.

The second coupler 133 has a branching function for branching and outputting the return light received from the second optical waveguide 14 to the first arm 132A and the second arm 132B. Furthermore, the first coupler 131 has a multiplexing function for multiplexing each of the pieces of return light that has passed through the first arm 132A and the second arm 132B and outputting the multiplexed light to the first optical waveguide 12. The AMZI 13A is an asymmetric Mach-Zehnder interferometer having different arms of the first arm 132A and the second arm 132B that are obtained by adjusting the first phase shifter 134.

The second optical waveguide 14 is an optical waveguide through which the light received from the second coupler 133 included in the AMZI 13A passes. A second phase shifter 14A is disposed in the second optical waveguide 14. The second phase shifter 14A is a heater that adjusts an optical path length of the second optical waveguide 14 obtained by adjusting the temperature of, for example, the second optical waveguide 14.

The first ring resonator 17A included in the first filter circuit 17 passes the light at a FSR 1 out of the light passing through the second optical waveguide 14, and then, outputs the passed light to the third optical waveguide 15. The FSR is a transmission wavelength interval of the transmittance peak. The FSR 1 is a FSR of the first ring resonator 17A. The first ring resonator 17A includes a third phase shifter 17A1 that shifts the phase of the first ring resonator 17A. The third phase shifter 17A1 is a heater that adjusts the FSR 1 of the first ring resonator 17A by adjusting the temperature of, for example, the first ring resonator 17A. For example, if the power of the heater is increased, the temperature of the silicon thin line of the first ring resonator 17A rises, and thus, the refractive index of the silicon thin line is increased. As a result, the length of the resonance wavelength of the first ring resonator 17A is increased, and the length of the wavelength in the first mode M1 is increased accordingly.

The second ring resonator 17B included in the first filter circuit 17 passes the light at a FSR 2 out of the light passing through the third optical waveguide 15, and then, outputs the passed light to the fourth optical waveguide 16. The FSR 2 is a FSR of the second ring resonator 17B. The second ring resonator 17B includes a fourth phase shifter 17B1 that shifts the phase of the second ring resonator 17B. The fourth phase shifter 17B1 is a heater that adjusts the FSR 2 of the second ring resonator 17B by adjusting the temperature of, for example, the second ring resonator 17B. For example, if the power of the heater is increased, the temperature of the silicon thin line of the second ring resonator 17B rises, and thus, the refractive index of the silicon thin line is increased. As a result, the length of the resonance wavelength of the second ring resonator 17B is increased, and the length of the wavelength of the first mode M1 is increased accordingly.

The FSR is different in each of the first ring resonator 17A and the second ring resonator 17B, so that the first ring resonator 17A and the second ring resonator 17B obtains the passband due to the vernier effect obtained from a series connection of these two ring resonators. The passband of each of the first ring resonator 17A and the second ring resonator 17B is within the gain band of the SOA 2, and each of the first ring resonator 17A and the second ring resonator 17B passes, from the gain band, light at the selected wavelength and light that has a wavelength in a recursive mode and that is produced on the short wavelength side or the long wavelength side of the selected wavelength.

The reflecting mirror 18 is a loop mirror that corresponds to the returning unit of the closed circuit included in the wavelength filter 3, that reflects the light that has been input from the fourth optical waveguide 16, and that returns the reflected return light to the fourth optical waveguide 16. Furthermore, a phase shifter 18A that adjusts an optical path length may also be provided on the reflecting mirror 18, and appropriate modifications are possible.

The second ring resonator 17B passes the light of the FSR 2 received from the return light that has been input from the fourth optical waveguide 16, and outputs the passed return light to the third optical waveguide 15. Furthermore, the first ring resonator 17A passes the light at the FSR 1 received from the return light that has been input from the third optical waveguide 15, and then, outputs the passed return light to the second optical waveguide 14.

The AMZI 13A sets the passband that suppresses the light that is in the recursive mode and that is produced on the short wavelength side and the long wavelength side of the selected wavelength. The AMZI 13A suppresses the light at the selected wavelength in the recursive mode received from the return light that has been input from the second optical waveguide 14, and then, outputs the return light at the selected wavelength to the first optical waveguide 12. The first optical waveguide 12 outputs the return light at the selected wavelength to the input/output unit 11. The input/output unit 11 outputs the return light at the selected wavelength received from the first optical waveguide 12 to the SOA 2. The SOA 2 performs optical amplification on the return light at the selected wavelength that has been received from the first optical waveguide 12, and outputs, as laser light, the return light at the selected wavelength subjected to optical amplification.

In other words, the light received from the SOA 2 is output to the reflecting mirror 18 by way of the route of the input/output unit 11, the first optical waveguide 12, the AMZI 13A, the second optical waveguide 14, the first ring resonator 17A, the third optical waveguide 15, the second ring resonator 17B, and the fourth optical waveguide 16 in this order. Furthermore, the return light received from the reflecting mirror 18 is output to the SOA 2 by way of the route of the fourth optical waveguide 16, the second ring resonator 17B, the third optical waveguide 15, the first ring resonator 17A, the second optical waveguide 14, the AMZI 13A, the first optical waveguide 12, and the input/output unit 11 in this order.

The material of the core constituting the optical waveguide of each of the first optical waveguide 12, the second filter circuit 13, the second optical waveguide 14, the first filter circuit 17, the third optical waveguide 15, and the fourth optical waveguide 16 included in the wavelength filter 3 is made of silicon (Si). Furthermore, the clad that covers the core of each of the first optical waveguide 12, the second filter circuit 13, the second optical waveguide 14, the first filter circuit 17, the third optical waveguide 15, and the fourth optical waveguide 16 is made of, for example, oxide silicon ($SiO_2$). Moreover, the SOA 2 is made of InP or the like.

Figure 2:
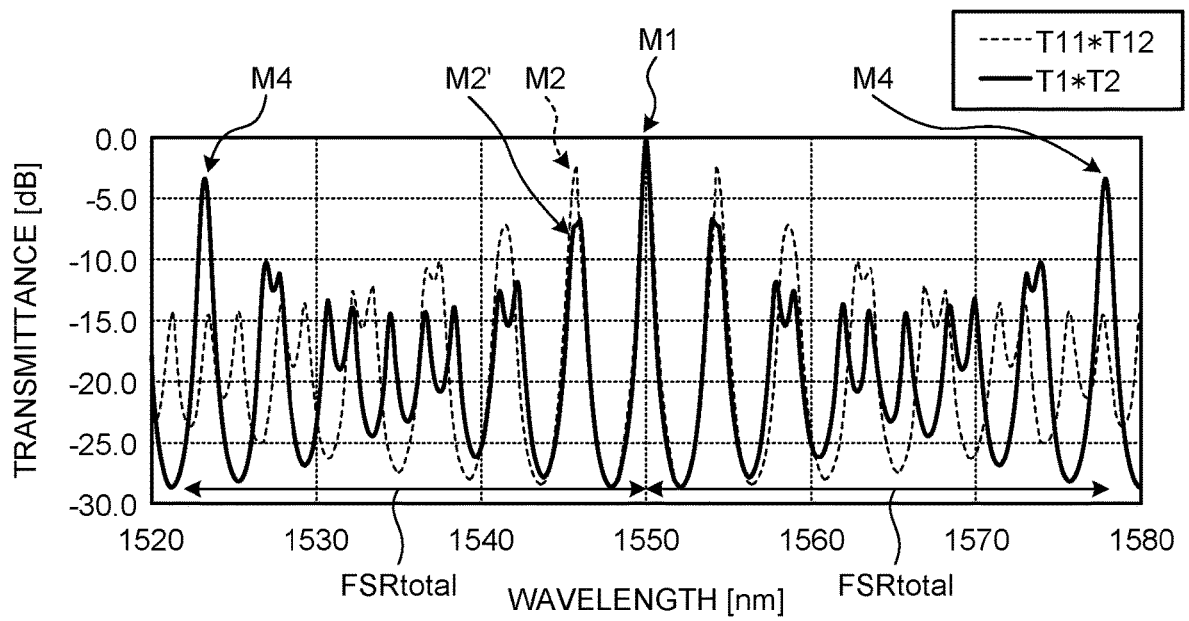
FIG. 2 is a diagram illustrating comparative example between a FSRtotal of each of the $11^{th}$ ring resonator and the $12^{th}$ ring resonator that are conventionally used and a FSRtotal of each of a first ring resonator and a second ring resonator according to the present embodiment.

FIG. 2 is a diagram illustrating a comparative example between the FSRtotal of the $11^{th}$ ring resonator and the $12^{th}$ ring resonator that are conventionally used and the FSRtotal of the first ring resonator 17A and the second ring resonator 17B according to the present embodiment. In FIG. 2, the FSRtotal of the $11^{th}$ ring resonator and the $12^{th}$ ring resonator is indicated by the dotted line, whereas the FSRtotal of the first ring resonator 17A and the second ring resonator 17B according to the present embodiment is indicated by the solid line. Furthermore, as a simulation condition, if the conventional FSRtotal is compared to the FSRtotal according to the present embodiment, it is assumed that the FSRtotal according to the present embodiment is twice as large as the conventional FSRtotal.

In the FSRtotal according to the present embodiment, the peak of the recursive mode M4 occurs on the long wavelength side and the short wavelength side that are sufficiently away from the peak of the selected wavelength M1 and that did not occur in the conventional FSRtotal. Furthermore, the peak of the recursive mode M4 has a transmittance that is a similar level of that of the peak of the first mode M1. Furthermore, in the FSRtotal according to the present embodiment, the second mode that is adjacent to the selected wavelength M1 is changed from M2 to M2', so that the mode gain difference has been improved. As a result, as illustrated in FIG. 2, the mode gain difference according to the present embodiment has been improved from the conventional mode gain difference, such as 2.5 dB to the 7.3 dB. Furthermore, if a FSR difference between the FSR 1 of the first ring resonator 17A and the FSR 2 of the second ring resonator 17B is made greater, the FSRtotal is narrow, and it is thus possible to improve the second mode M2.

The transmittance of the AMZI 13A is able to be calculated on the basis of T $(\lambda)=1/2(1+\cos(2\pi/\lambda \cdot n\Delta L))$, where T $(\lambda)$ denotes a transmittance of the AMZI 13A, n denotes an effective refractive index of the waveguide of each of the first arm 132A and the second arm 132B, and $\Delta L$ denotes an optical path length difference between the first arm 132A and the second arm 132B included in the AMZI 13A. If the structure is designed to reduce the optical path length difference $\Delta L$, even when $\lambda$ varies, the phase rotation is moderate and the AMZI 13A is a wide-band filter. As a result, as mentioned above as a problem in the conventional technology, the passband of the AMZI 13A is not sharp, so that the sensitivity of the passband decreased. Consequently, a certain amount of shift is able to be absorbed even if the passband is slightly shifted.

Figure 3:
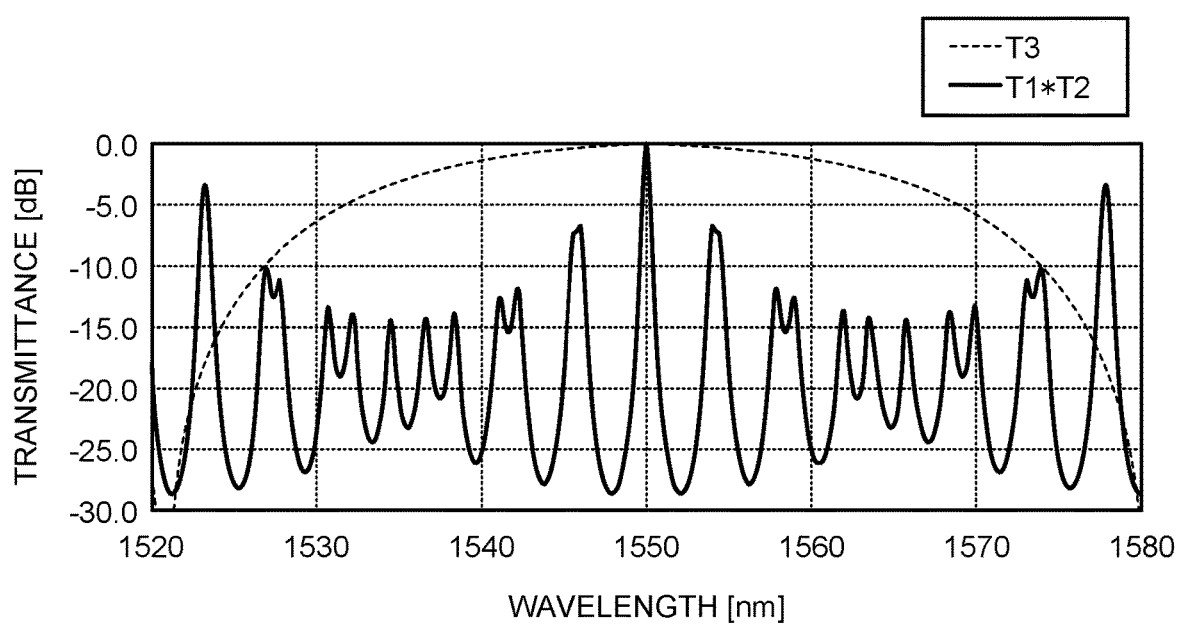
FIG. 3 is a diagram illustrating an example of the filter characteristics of a first filter circuit and a second filter circuit according to the present embodiment.

The recursive mode M4 illustrated in FIG. 2 is produced in a wavelength away from the first mode M1 at the selected wavelength toward each of long wavelength side and the short wavelength side by an amount about 30 nm. Therefore, as illustrated in FIG. 3, the range of 60 nm that corresponds to ±30 nm from the first mode M1 at the selected wavelength is set to the FSR 3 of the AMZI 13A. As a result, the AMZI 13A is able to suppress the recursive mode from the gain band.

Figure 9:
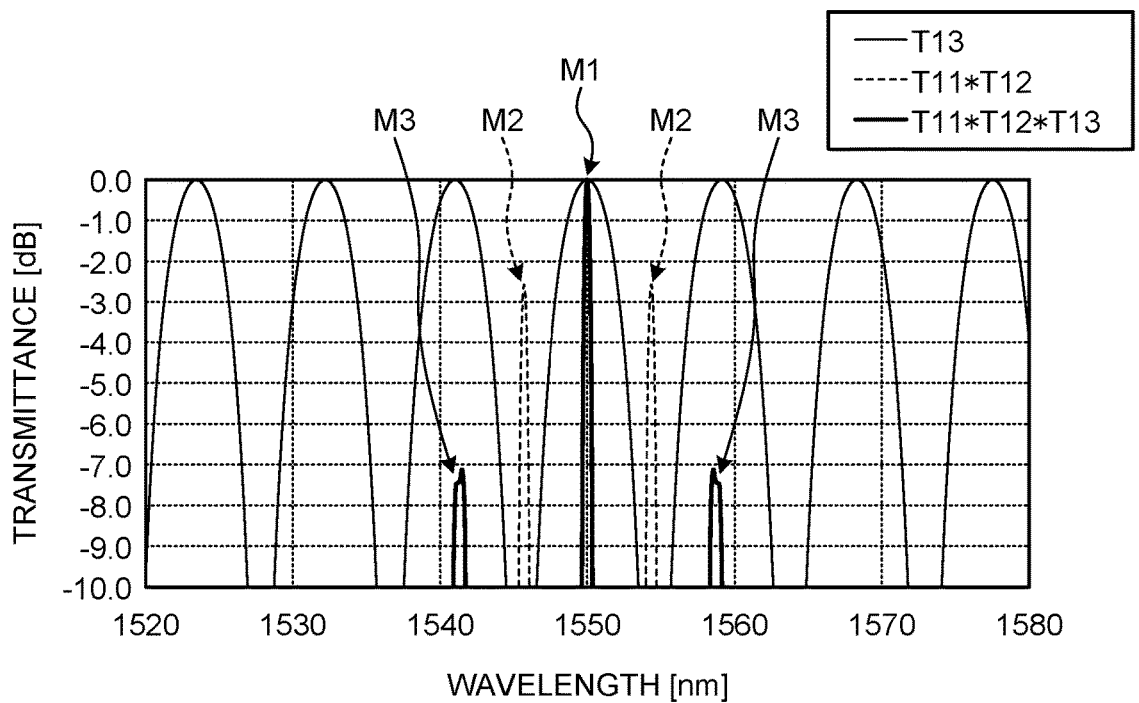
FIG. 9 is a diagram illustrating an example of transmittance, in a first mode, a second mode, and a third mode, of the $11^{th}$ ring resonator, the $12^{th}$ ring resonator, and the AMZI that are conventionally used.
Figure 10:
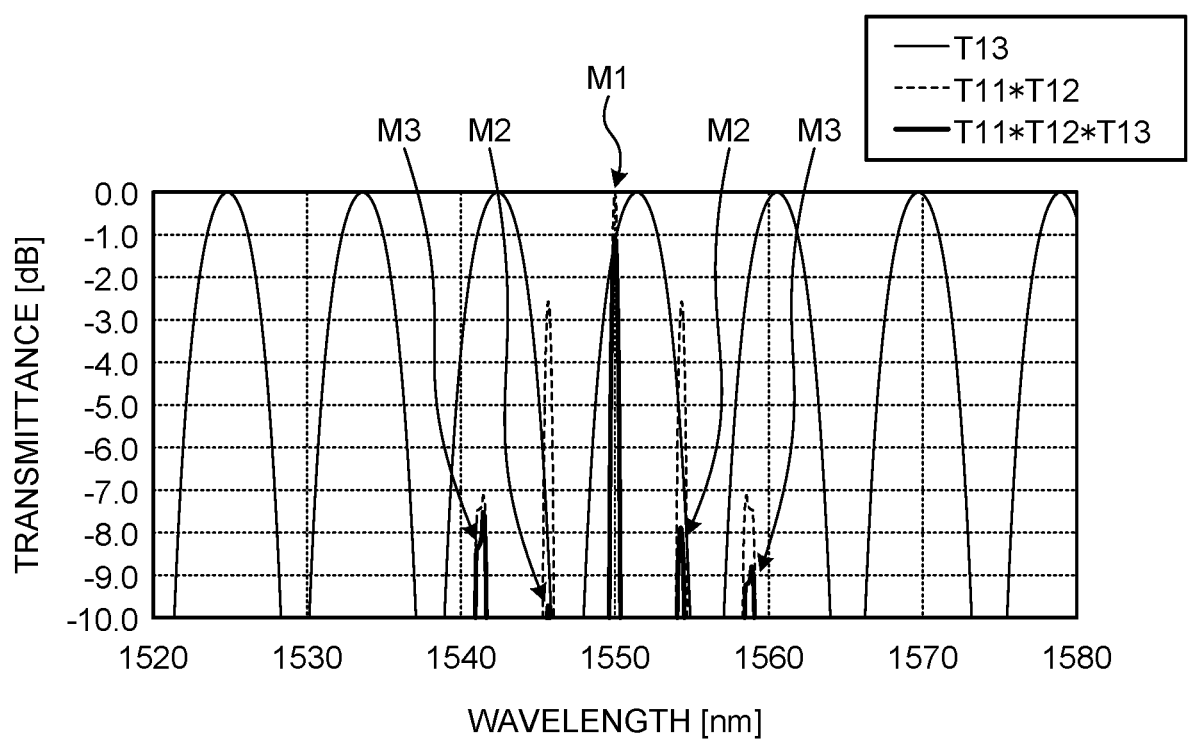
FIG. 10 is a diagram illustrating an example of transmittance in the first mode, the second mode, and the third mode in the case where a passband of the conventional AMZI is shifted.

FIG. 3 is a diagram illustrating an example of the filter characteristics of the second filter circuit 13 and the first filter circuit 17 according to the present embodiment. The symbol T1*T2 illustrated in FIG. 3 denotes the passbands of the first ring resonator 17A and the second ring resonator 17B. The symbol T3 illustrated in FIG. 3 denotes the passband of the AMZI 13A. As a result, an attenuation effect of a selected wavelength ratio of 20 dB is expected in the vicinity of the recursive mode M4. The passband of the AMZI 13A illustrated in FIG. 3 is moderate as compared to the passband of the conventional AMZI illustrated in FIG. 9.

Figure 4:
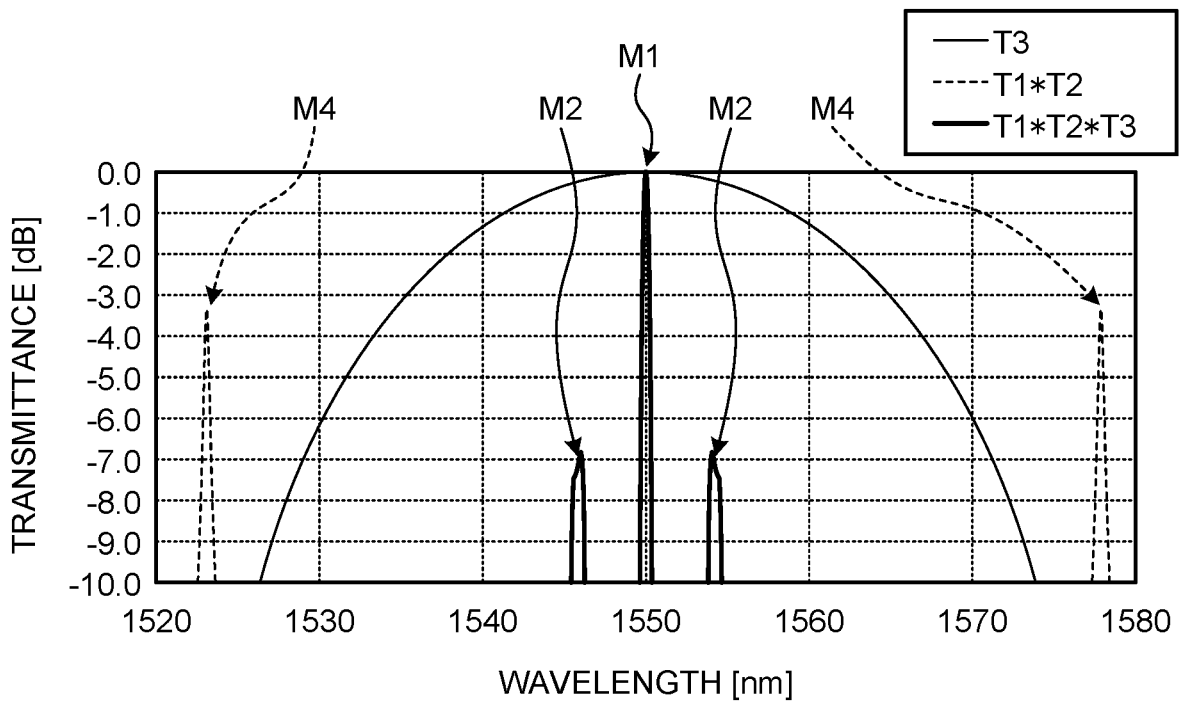
FIG. 4 is a diagram illustrating a transmittance of each of the first ring resonator, the second ring resonator, and an AMZI according to the present embodiment in a first mode, a second mode, and a recursive mode.

FIG. 4 is a diagram illustrating an example of a transmittance of each of the first ring resonator 17A, the second ring resonator 17B, and the AMZI 13A according to the present embodiment in the first mode M1, the second mode M2, and the recursive mode M4. FIG. 4 illustrates a passband T3 of the AMZI 13A, the passband T1*T2 of the first ring resonator 17A and the second ring resonator 17B, a passband T1*T2*T3 of the AMZI 13A, the first ring resonator 17A, and the second ring resonator 17B. In the passband T3, a change in the transmission characteristics in the vicinity of the selected wavelength M1 is small, so that the second mode M2 is almost unchanged; however, it is observed that the recursive mode M4 is sufficiently suppressed.

Figure 5:
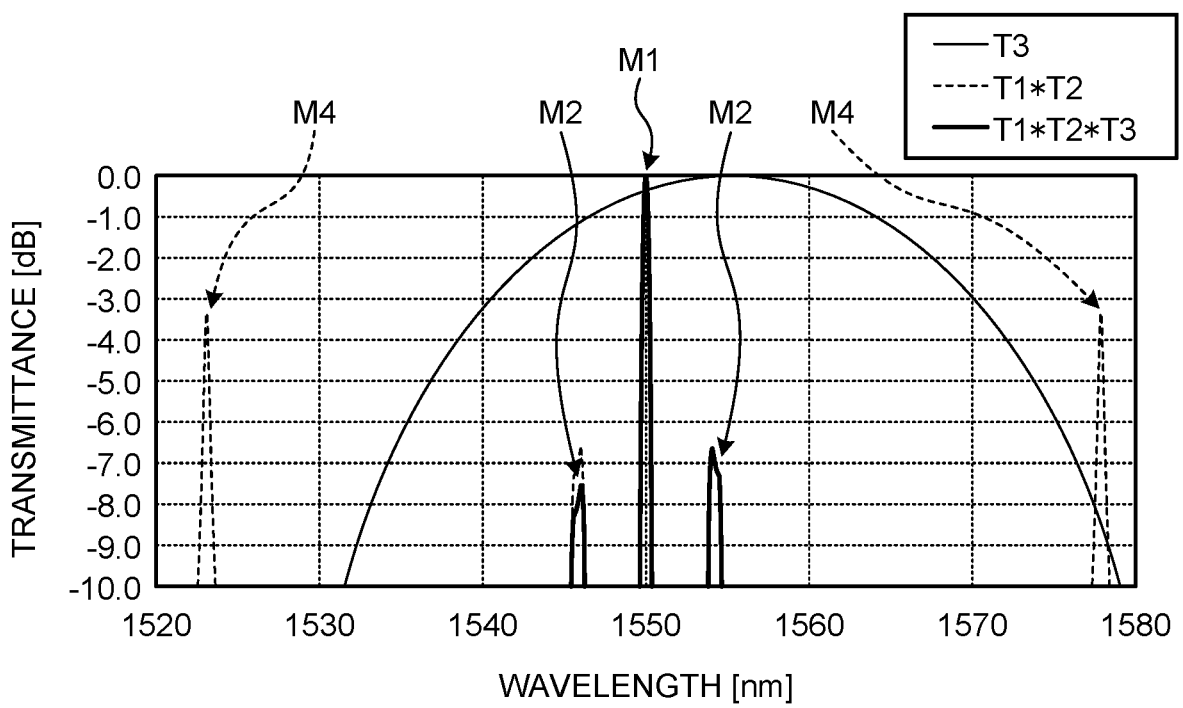
FIG. 5 is a diagram illustrating an example of a transmittance of each of the first mode, the second mode, and the recursive mode in the case where a passband of the AMZI is shifted.

FIG. 5 is a diagram illustrating an example of a transmittance in each of the first mode M1, the second mode M2, and the recursive mode M4 in the case where the passband of the AMZI 13A is shifted. For example, even when the passband T3 of the AMZI 13A is shifted by an amount of 5 nm, a suppression effect of the recursive mode M4 due to the passband T3 of the AMZI 13A is almost unchanged, and a decrease in the peak of the selected wavelength M1 is within a range of about 0.3 dB. As a result, as compared to the passband T13 of the AMZI according to the conventional technology, it is found that tolerance of a wide bandwidth of the passband T3 of the AMZI 13A is very moderate.

The FSRtotal of the first ring resonator 17A and the second ring resonator 17B is set to be within the used wavelength range, so that the mode gain difference in the vicinity of the selected wavelength is secured. Furthermore, the AMZI 13A is used as the filter that suppresses the light that is in the recursive mode M4 and that is produced in the used wavelength range.

The FSR of the AMZI 13A is defined as the FSR 3. The relationship between the FSR 3 and the FSRtotal is represented by the FSR 3=1.5 to 3×FSRtotal. By narrowing the FSRtotal while expanding the FSR 3 greater than that conventionally used, the light of the recursive mode M4 is suppressed by the AMZI 13A while increasing the mode gain difference between the selected wavelength M1 and the second mode M2 that is in the vicinity of the selected wavelength. The transmission wavelength of the AMZI 13A has a passband with a wide band, so that a change in the direction of the wavelength decreases.

Figure 6:
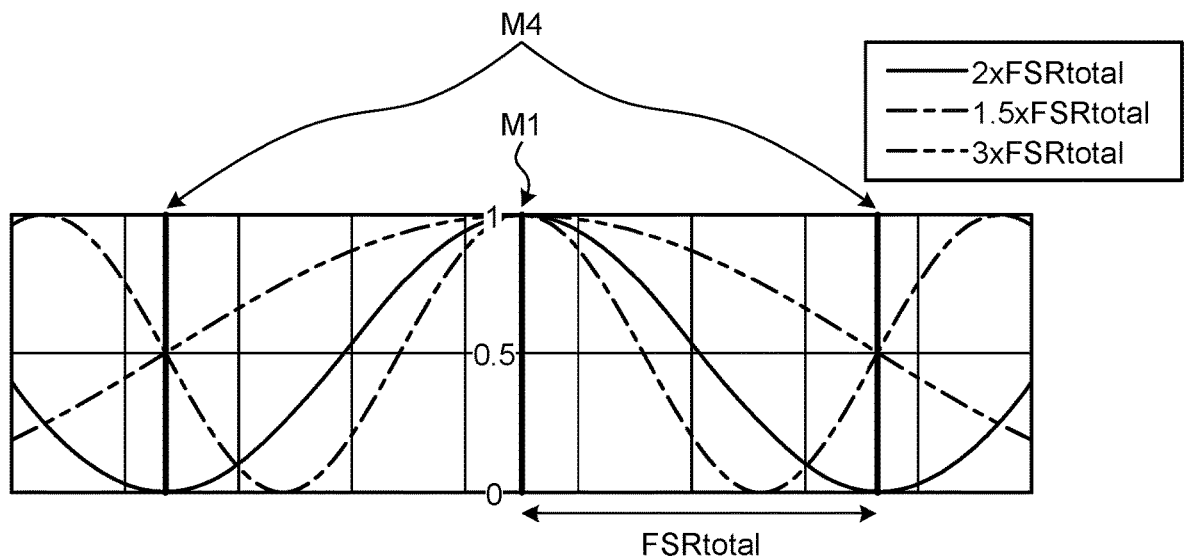
FIG. 6 is a diagram illustrating a relationship between a FSR 3 of the AMZI and the FSRtotal according to the present embodiment.
Figure 7:
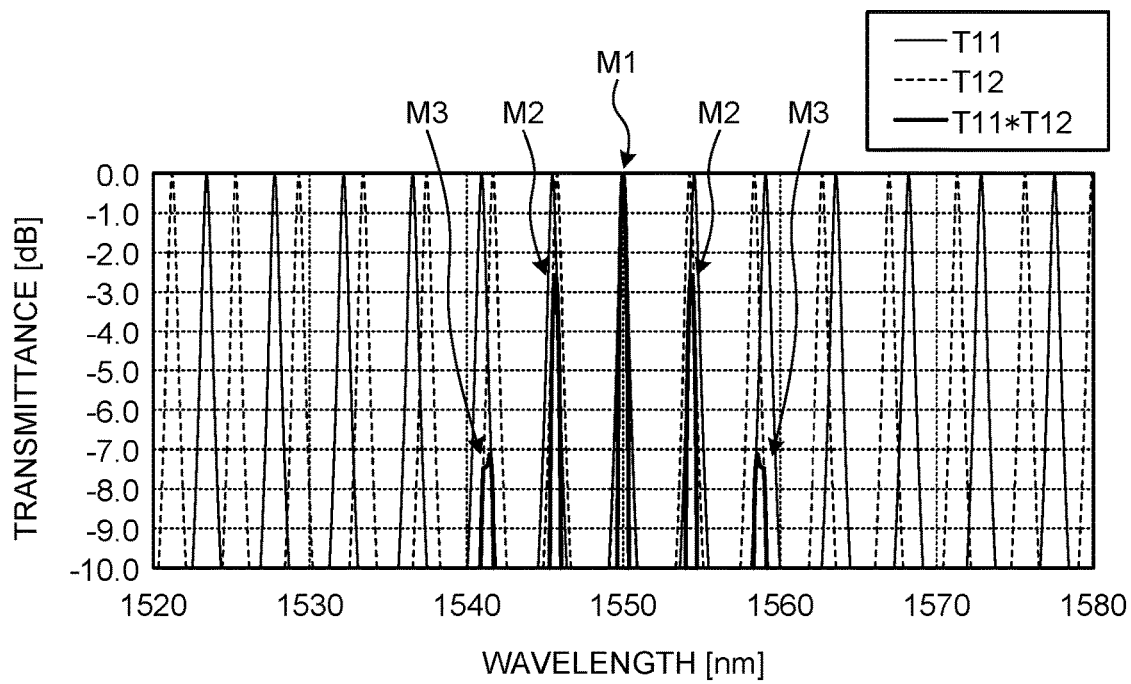
FIG. 7 is a diagram illustrating an example of filter characteristics of a conventional ring resonator.
Figure 8:
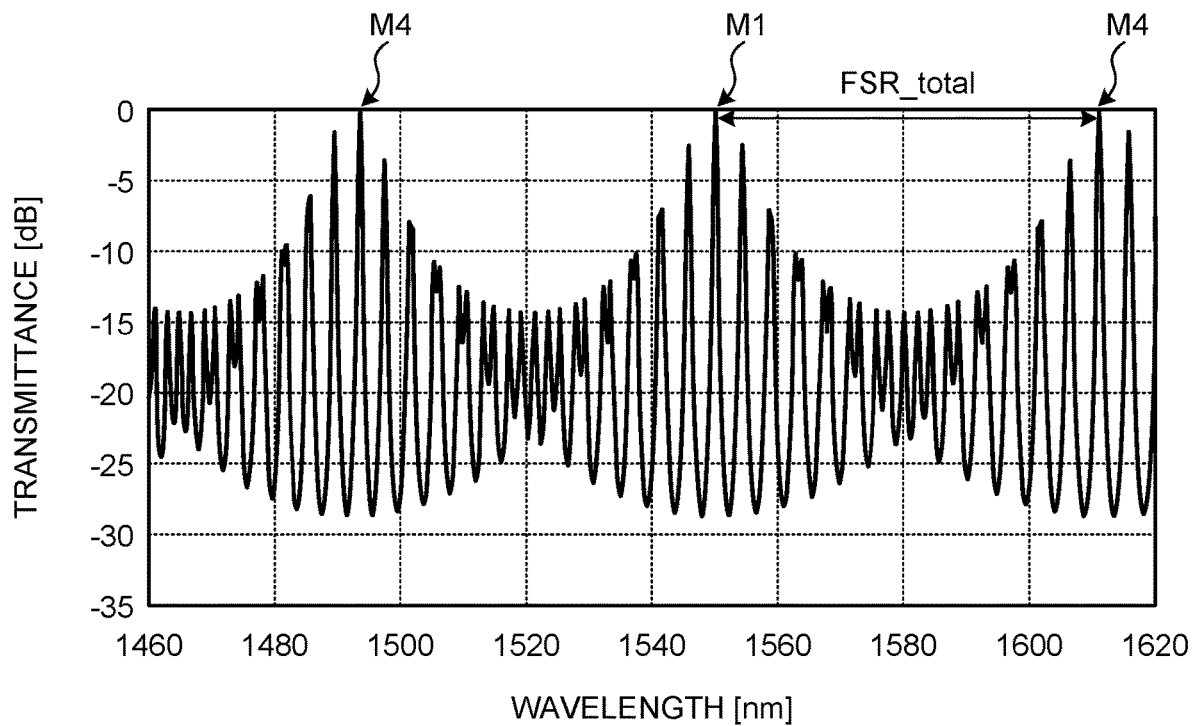
FIG. 8 is a diagram illustrating an example of a recursive mode with respect to a first mode.

FIG. 6 is a diagram illustrating the relationship between the FSR 3 and the FSRtotal of the AMZI 13A according to the present embodiment. The FSR 3 at the AMZI 13A is a passband (solid line) in the case where, for example, the FSR 3 is defined as about twice as large as the FSRtotal. If the FSR 3 of the AMZI 13A is defined as about twice as large as the FSRtotal, the AMZI 13A is able to completely suppress the light in the recursive mode M4 on the short wavelength side of the selected wavelength M1 and the light in the recursive mode M4 on the long wavelength side of the selected wavelength M1.

The FSR 3 of the AMZI 13A is a passband (dashed-dotted line) in the case where, for example, the FSR 3 is defined as about 1.5 times as large as the FSRtotal. If the FSR 3 of the AMZI 13A is defined as about 1.5 times as large as the FSRtotal, the AMZI 13A is able to suppress the light of the recursive mode M4 on the short wavelength side and the light of the recursive mode M4 on the long wavelength side of the selected wavelength M1 to a level equal to or less than 3 dB.

The FSR 3 of the AMZI 13A is a passband (dashed-two dotted line) in the case where, for example, the FSR 3 is defined as about 3 times as large as the FSRtotal. If the FSR 3 of the AMZI is defined as 3 times as large as the FSRtotal, the AMZI is able to suppress the light of recursive mode M4 on the short wavelength side of the selected wavelength M1 and the light of the recursive mode M4 on the long wavelength side of the selected wavelength M1 to a level equal to or less than 3 dB.

The passband T3 of the AMZI 13A is set such that transmittance is the maximum at the wavelength corresponding to the first mode M1, whereas the transmittance is the minimum at the wavelength in the recursive mode M4 produced on short wavelength side and the long wavelength side of the first mode M1. The FSR 3 of the AMZI 13A controls the first phase shifter 134 in order to adjust the optical path difference between the first arm 132A and the second arm 132B to be 1.5 times to 3 times the transmittance FSRtotal of the first ring resonator 17A and the second ring resonator 17B. As a result, by performing control of the optical path difference by using the first phase shifter 134, it is possible to shift the peak of the transmittance of the AMZI 13A that suppresses the light in the recursive mode.

The wavelength filter 3 according to the present embodiment is connected to the first filter circuit 17 and the second filter circuit 13 in series. The first filter circuit 17 connects, in series, to the first ring resonator 17A and the second ring resonator 17B each having a different FSR. The passband obtained from the vernier effect of the first ring resonator 17A and the second ring resonator 17B connected in series is within the gain band of the SOA 2, and each of the first ring resonator 17A and the second ring resonator 17B passes, from the gain band, the light at the selected wavelength and the light that has the wavelength in the recursive mode and that is produced on the short wavelength side or the long wavelength side of the selected wavelength. As a result, it is possible to secure the mode gain difference by expanding the range of the FSRtotal. Furthermore, the second filter circuit 13 is connected to the first filter circuit 17 in series, and suppresses the light at the wavelength in the recursive mode from the light passing through the first filter circuit 17. As a result, the passband of the second filter circuit 13 that suppresses the light in the recursive mode is a wide band and moderate, so that it is possible to pass the light at the selected wavelength having a high peak even if the passband is slightly shifted.

The second filter circuit 13 is constituted of the AMZI 13A having the transmission characteristics of the FSR 3 that is 1.5 times to 3 times the FSRtotal of the peak of the selected wavelength M1 passed through the first filter circuit 17 and the peak of the recursive mode M4 with respect to the selected wavelength M1. As a result, the passband of the AMZI 13A that suppresses the light in the recursive mode is a wide band and moderate, so that it is possible to pass the light at the selected wavelength having the high peak even if the passband of the AMZI 13A is slightly shifted.

The first filter circuit 17 adjusts the passband that passes the light at the selected wavelength in accordance with adjustment of the resonance wavelength of at least one of the ring resonators between the first ring resonator 17A and the second ring resonator 17B. As a result, it is possible to adjust the passband through which the selected wavelength passes in accordance with the adjustment of the resonance wavelength.

The first filter circuit 17 adjusts the passband through which the light at the selected wavelength passes in accordance with the adjustment of the temperature performed by the phase shifter of at least one of the ring resonators between the first ring resonator 17A and the second ring resonator 17B. As a result, it is possible to adjust the passband through which the selected wavelength passes in accordance with the adjustment of the temperature performed by the third phase shifter 17A1 or the fourth phase shifter 17B1.

The wavelength filter 3 includes the loop closed circuit in which the first filter circuit 17 and the second filter circuit 13 are connected in series, and the input/output unit 11 that is disposed in the input stage of the closed circuit, that is optically coupled with the SOA 2, and that inputs and outputs the light received from and to the SOA 2. As a result, the wavelength filter 3 is able to implement the closed circuit in which an input and an output is performed in the same unit.

The wavelength filter 3 includes the loop closed circuit in which the first filter circuit 17 and the second filter circuit 13 are connected in series, the input/output unit 11 that is disposed in the input stage of the closed circuit, that is optically coupled with the SOA 2, and that inputs and outputs light received from and to the SOA 2, and the reflecting mirror 18 that is disposed on the returning unit in the closed circuit and that reflects light. As a result, it is possible to implement the wavelength filter 3 in the loop closed circuit.

The first filter circuit 17 and the second filter circuit 13 are formed on the same substrate, and connects the first filter circuit 17 and the second filter circuit 13 in series by using the optical waveguides. As a result, it is possible to reduce the size of the wavelength filter 3.

Furthermore, the wavelength filter 3 includes the core made of silicon and the clad that covers the core and that is made of oxide silicon. The difference of the refractive index between the core and the clad is made large. As a result, for example, light is easily bent inside the first ring resonator 17A and the second ring resonator 17B, it is possible to reduce the size of the wavelength filter 3.

The first ring resonator 17A, the second ring resonator 17B, and the AMZI 13A are connected in series inside the loop closed circuit included in the wavelength filter 3. As a result, it is possible to shorten the length of the resonator of the ring resonators, so that it is possible to reduce the size of the wavelength filter 3.

In the present embodiment, the passband of the AMZI 13A is a wide band, so that, once a setup is made such that a mode gain difference is sufficiently obtained, this eliminate a need to control the passband of the AMZI 13A. As a result, it is possible to implement the stable wavelength filter 3 and the laser apparatus 1 provided with the wavelength filter 3.

If the FSR 3 is set once, the AMZI 13A has a tolerance of a very wide wavelength shift as long as an oscillation wavelength is not changed, so that adjustment of the first phase shifter 134 included in the AMZI 13A is not needed during an operation, and thus, an algorithm for stable control of the wavelength is simplified.

In addition, in the present embodiment, a case has been described as an example in which the AMZI 13A is directly connected between the first optical waveguide 12 and the second optical waveguide 14. However, the AMZI 13A may be disposed at any location as long as the AMZI 13A is connected between the first ring resonator 17A and the second ring resonator 17B in series, and appropriate modifications are possible.

Furthermore, a case has been described as an example in which two ring resonators of the first ring resonator 17A and the second ring resonator 17B are disposed; however, the number of ring resonators is not limited to two, but, for example, three or more ring resonators may be disposed, and appropriate modifications are possible.

In addition, in the present embodiment, a case has been described as an example in which the AMZI 13A is disposed between the first optical waveguide 12 and the second optical waveguide 14. However, the configuration is not limited to the AMZI 13A, but it may be possible to dispose a filter having a passband that suppresses the recursive mode M4 with respect to the first mode M1, and appropriate modifications are possible.

In addition, in the wavelength filter 3, the second filter circuit 13 and the first filter circuit 17 are connected as a series connection. The wavelength filter 3 is a linear circuit, so that any order of connections may be used.

Both of the first phase shifter 134 included in the AMZI 13A and the second phase shifter 14A included in the second optical waveguide 14 need not always be provided, but one of them may be provided.

The wavelength filter 3 may possibly be subject to wavelength shift from the set wavelength due to aged deterioration, environmental changes, or the like during an operation. In order to avoid this circumstances and in order to stably operate a laser oscillation wavelength called a wavelength locker, the wavelength filter 3 may suppress the wavelength shift by detecting an amount of wavelength shift and feeding back the phase shifter.

It is conceivable to configure the wavelength filter 3 such that the route that has been branched off from the input/output unit 11 in a Y-shaped manner is used as a loop closed circuit, and two ring resonators of the first ring resonator 17A and the second ring resonator 17B are connected to the AMZI 13A in series in the closed circuit; however, the basic idea is the same.

Furthermore, in order to obtain a high output, a SOA used for a boost may be mounted instead of the SOA 2, and appropriate modifications are possible.

According to an aspect of an embodiment of the wavelength filter disclosed in the present application, it is possible to pass a selected wavelength having a high peak.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wavelength filter comprising:
   a first filter circuit
      that has a passband that is obtained from a vernier effect by connecting, in series, a plurality of ring resonators each having a different transmission wavelength interval and that is within a gain band of an optical amplifier, and
      that passes, from the gain band, light at a selected wavelength and light that has a wavelength in a recursive mode and that is produced on a short wavelength side or a long wavelength side of the selected wavelength; and
   a second filter circuit that is connected to the first filter circuit in series and that suppresses the light at the wavelength in the recursive mode from the light passing through the first filter circuit.

2. The wavelength filter according to claim 1, wherein the second filter circuit is an asymmetric Mach-Zehnder interferometer having transmission characteristics of a transmission wavelength interval 1.5 times to 3 times a transmission wavelength interval between the selected wavelength and the wavelength in the recursive mode with respect to the selected wavelength.

3. The wavelength filter according to claim 1, wherein the first filter circuit adjusts the passband through which the light at the selected wavelength passes in accordance with adjustment of a resonance wavelength of at least one of the plurality of ring resonators out of the plurality of ring resonators.

4. The wavelength filter according to claim 2, wherein the first filter circuit adjusts the passband through which the light at the selected wavelength passes in accordance with adjustment of a resonance wavelength of at least one of the plurality of ring resonators out of the plurality of ring resonators.

5. The wavelength filter according to claim 1, wherein the first filter circuit adjusts the passband through which the light at the selected wavelength passes in accordance with adjustment of a temperature of at least one of the plurality of ring resonators.

6. The wavelength filter according to claim 2, wherein the first filter circuit adjusts the passband through which the light at the selected wavelength passes in accordance with adjustment of a temperature of at least one of the plurality of ring resonators.

7. The wavelength filter according to claim 1, further comprising:
a closed circuit that is a loop closed circuit and that connects the first filter circuit and the second filter circuit in series; and
an input/output unit that is disposed in an input stage of the closed circuit, that is optically coupled to the optical amplifier, and that inputs and outputs the light received from and to the optical amplifier.

8. The wavelength filter according to claim 2, further comprising:
a closed circuit that is a loop closed circuit and that connects the first filter circuit and the second filter circuit in series; and
an input/output unit that is disposed in an input stage of the closed circuit, that is optically coupled to the optical amplifier, and that inputs and outputs the light received from and to the optical amplifier.

9. The wavelength filter according to claim 3, further comprising:
a closed circuit that is a loop closed circuit and that connects the first filter circuit and the second filter circuit in series; and
an input/output unit that is disposed in an input stage of the closed circuit, that is optically coupled to the optical amplifier, and that inputs and outputs the light received from and to the optical amplifier.

10. The wavelength filter according to claim 4, further comprising:
a closed circuit that is a loop closed circuit and that connects the first filter circuit and the second filter circuit in series; and
an input/output unit that is disposed in an input stage of the closed circuit, that is optically coupled to the optical amplifier, and that inputs and outputs the light received from and to the optical amplifier.

11. The wavelength filter according to claim 1, further comprising:
a closed circuit that is a loop closed circuit and that connects the first filter circuit and the second filter circuit in series;
an input/output unit that is disposed in an input stage of the closed circuit, that is optically coupled to the optical amplifier, and that inputs and outputs the light received from and to the optical amplifier; and
a reflecting unit that is disposed on a returning unit included in the closed circuit and that reflects the light.

12. The wavelength filter according to claim 2, further comprising:
a closed circuit that is a loop closed circuit and that connects the first filter circuit and the second filter circuit in series;
an input/output unit that is disposed in an input stage of the closed circuit, that is optically coupled to the optical amplifier, and that inputs and outputs the light received from and to the optical amplifier; and
a reflecting unit that is disposed on a returning unit included in the closed circuit and that reflects the light.

13. The wavelength filter according to claim 3, further comprising:
a closed circuit that is a loop closed circuit and that connects the first filter circuit and the second filter circuit in series;
an input/output unit that is disposed in an input stage of the closed circuit, that is optically coupled to the optical amplifier, and that inputs and outputs the light received from and to the optical amplifier; and
a reflecting unit that is disposed on a returning unit included in the closed circuit and that reflects the light.

14. The wavelength filter according to claim 4, further comprising:
a closed circuit that is a loop closed circuit and that connects the first filter circuit and the second filter circuit in series;
an input/output unit that is disposed in an input stage of the closed circuit, that is optically coupled to the optical amplifier, and that inputs and outputs the light received from and to the optical amplifier; and
a reflecting unit that is disposed on a returning unit included in the closed circuit and that reflects the light.

15. The wavelength filter according to claim 1, wherein the first filter circuit and the second filter circuit are formed on a same substrate and are connected in series by an optical waveguide between the first filter circuit and the second filter circuit.

16. The wavelength filter according to claim 2, wherein the first filter circuit and the second filter circuit are formed on a same substrate and are connected in series by an optical waveguide between the first filter circuit and the second filter circuit.

17. The wavelength filter according to claim 3, wherein the first filter circuit and the second filter circuit are formed on a same substrate and are connected in series by an optical waveguide between the first filter circuit and the second filter circuit.

18. The wavelength filter according to claim 4, wherein the first filter circuit and the second filter circuit are formed on a same substrate and are connected in series by an optical waveguide between the first filter circuit and the second filter circuit.

19. The wavelength filter according to claim 15, wherein the same substrate includes a core that is made of silicon and a clad that covers the core and that is made of oxide silicon.

20. A laser apparatus comprising:
an optical amplifier that has a gain band; and
a wavelength filter that is optically coupled to the optical amplifier, wherein
the wavelength filter includes
a first filter circuit
that has a passband that is obtained from a vernier effect by connecting, in series, a plurality of ring resonators each having a different transmission wavelength interval and that is within a gain band of an optical amplifier, and that passes, from the gain band, light at a selected wavelength and light that has a wavelength in a recursive mode and that is produced on a short wavelength side or a long wavelength side of the selected wavelength, and a second filter circuit that is connected to the first filter circuit in series and that suppresses the light at the wavelength in the recursive mode from the light passing through the first filter circuit.

\* \* \* \* \*